United States Patent
DeCrosta

(10) Patent No.: US 7,181,306 B2
(45) Date of Patent: Feb. 20, 2007

(54) ENHANCED PLASMA ETCH PROCESS

(75) Inventor: David A. DeCrosta, Melbourne, FL (US)

(73) Assignee: Intersil Americas, Inc., Milipitas, CA (US)

( * ) Notice: Subject to any disclaimer, the term of this patent is extended or adjusted under 35 U.S.C. 154(b) by 77 days.

(21) Appl. No.: 10/942,995

(22) Filed: Sep. 17, 2004

(65) Prior Publication Data
US 2005/0236108 A1  Oct. 27, 2005

Related U.S. Application Data

(60) Provisional application No. 60/564,983, filed on Apr. 26, 2004.

(51) Int. Cl.
*G06F 19/00* (2006.01)
*C25F 1/00* (2006.01)
*H01L 21/00* (2006.01)

(52) U.S. Cl. .............................. 700/117; 134/1.1; 438/9
(58) Field of Classification Search .................. 700/95, 700/117, 121; 134/1.1, 1.2, 1.3; 438/9
See application file for complete search history.

(56) References Cited

U.S. PATENT DOCUMENTS

| 3,526,560 | A | * | 9/1970 | Thomas ................. 156/345.15 |
| 5,230,771 | A | * | 7/1993 | Roselle ........................ 216/67 |
| 5,545,289 | A | * | 8/1996 | Chen et al. ................. 438/694 |
| 6,003,526 | A | * | 12/1999 | Lo et al. ....................... 134/1.1 |
| 6,254,720 | B1 | * | 7/2001 | Shih ...................... 156/345.15 |
| 6,541,164 | B1 | * | 4/2003 | Kumar et al. .................. 430/5 |
| 2003/0045098 | A1 | * | 3/2003 | Verhaverbeke et al. ..... 438/689 |
| 2004/0118464 | A1 | * | 6/2004 | Chang et al. ............... 137/630 |
| 2004/0217311 | A1 | * | 11/2004 | Lu ............................. 251/122 |
| 2005/0155718 | A1 | * | 7/2005 | Huang et al. ............... 156/915 |

* cited by examiner

*Primary Examiner*—Leo Picard
*Assistant Examiner*—Sean Shechtman
(74) *Attorney, Agent, or Firm*—Barnes & Thornburg LLP

(57) ABSTRACT

A method of operating a plasma etcher wherein gas is introduced into the etcher at a substantially higher rate than a previous standard rate for a desired etch selectivity, and the throttle valve's open value is set to a substantially greater open value than a previous standard open value for the desired etch selectivity. The method may also include introducing the gas at a lower pressure than the pressure of the previous standard pressure for a desired etch selectivity.

19 Claims, 4 Drawing Sheets

ENHANCED PLASMA ETCH PROCESS

CROSS-REFERENCE

This application claims the benefit of U.S. Provisional Patent Application Ser. No. 60/564,983 filed on Apr. 26, 2004, which is incorporated herein by reference.

BACKGROUND AND SUMMARY OF THE DISCLOSURE

The present disclosure relates generally to plasma etch processes and, more specifically, to the plasma etch processes used in the manufacture of integrated circuits, MEMS (micro electronic machines), and flat panel displays.

Integrated circuits include many layers (for example, oxides, nitrides, polycrystalline silicon, single metal films, sandwich stacked metal films, and other materials) that require plasma etching. Since integrated circuits are to be as planar as possible, there are etching processes that take place which require the ability to selectively etch one material compared to the other in order to produce planarization. Plasma etching includes introducing a reactant gas into the chamber and forming a plasma etching by applying an energy source. Depending upon the gases, a carrier or a strike gas may be included. The strike gas is that which is responsive to the applied rf energy at a low enough pressure to create a plasma which then results in breakdown of the reactant gases to radical reactants which then selectively etch one material more than another.

The reactant gases, with or without the carrier gas, are introduced into the plasma chamber at a given flow rate and proportion. The resulting plasma etches the surface of the target within the chamber, which generally is a wafer with a plurality of dies or integrated circuits. Below the target is an exhaust valve connected to turbo and roughing pumps by a throttle valve. The roughing pump brings the pressure low enough to allow the turbo pump to be turned on. The turbo and roughing pumps and throttle valve in combination control the removal of by-products. A control system including a Baratron (pressure transducer) controls the opening of the throttle valve to maintain a constant pressure in the chamber and an even exit flow. An example is shown in FIG. 1.

Although the present disclosure has examples using the Applied P5000 Etcher of Applied Materials, other models and other manufacturers' etchers may be used. The etch processes have been set up based on varying etch gas flows, varying pressure and varying throttle valve opening values to achieve a desired etch rate and desired levels of non-uniformity of etching as measured on a pilot process. This is not done on a product or product line basis. Non-uniformity creates areas or dies within the wafer, which either must be re-worked or scrapped totally. The ones that are underetched are capable of being re-worked, but those that are overetched must be scrapped. Where one or more reactant gases are used, it is desirable that the adjustability of the ratio between and/or the flow rate of the two gases be as large as possible within the constraints of the selectivity and non-uniformity criteria. The quantity and flow rate and throttle valve settings used in the pilot programs are not always applicable in the production line fabrication.

The throttle valves are generally set in a range below 25 steps of an 800-step fully-opened valve. When the turbo pump surges, the system cannot adequately control the low gas flows within the etching chamber and, therefore, leads to non-uniform etching. The exhaust port at one side of the etching chamber makes the etching chamber very sensitive to rapid changes of flow and limits the ability to maintain uniformity across the etching chamber.

The present disclosure is a method of operating a plasma etcher wherein gas is introduced into the etcher at a substantially higher rate than a previous standard rate for a desired etch selectivity, and the throttle valve's open value is set to a substantially greater open value than a previous standard open value for the desired etch selectivity. The rate is increased by at least, approximately twice, and the throttle valve's open value is increased by at least, approximately four times. The method may also include introducing the gas at a lower pressure than the pressure of the previous standard pressure for a desired etch selectivity. The pressure is reduced by at least, approximately one-half.

The method reduces the non-uniformity of etching in and/or increasing the flow rate window of the gas in the plasma etcher for a desired etch selectivity.

An electrical device made from a process including the disclosed etching steps include one or more of an integrated circuit, micro electronic machines and flat panel displays.

A plasma etcher according to the disclosure includes a chamber with a gas inlet for at least one gas and an exhaust port, an rf energy applicator for creating a plasma, and a throttle valve connecting the exhaust port to a pump. A control system introduces the gas into the chamber at a substantially higher rate than a previous standard rate for a desired etch selectivity and sets an open value of the throttle valve to a substantially greater open value than a previous standard open value for the desired etch selectivity.

The plasma etcher may include a first throttle valve connecting the exhaust port to a first pump via a first conduit; and a second throttle valve connecting the exhaust port to a second pump via a second conduit. The first conduit has a larger diameter than the diameter of the second conduit. The control system operates the opening of the first throttle valve for a dry cycle after a cleaning cycle of the etcher and operates the opening of the second throttle valve during an etching cycle.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
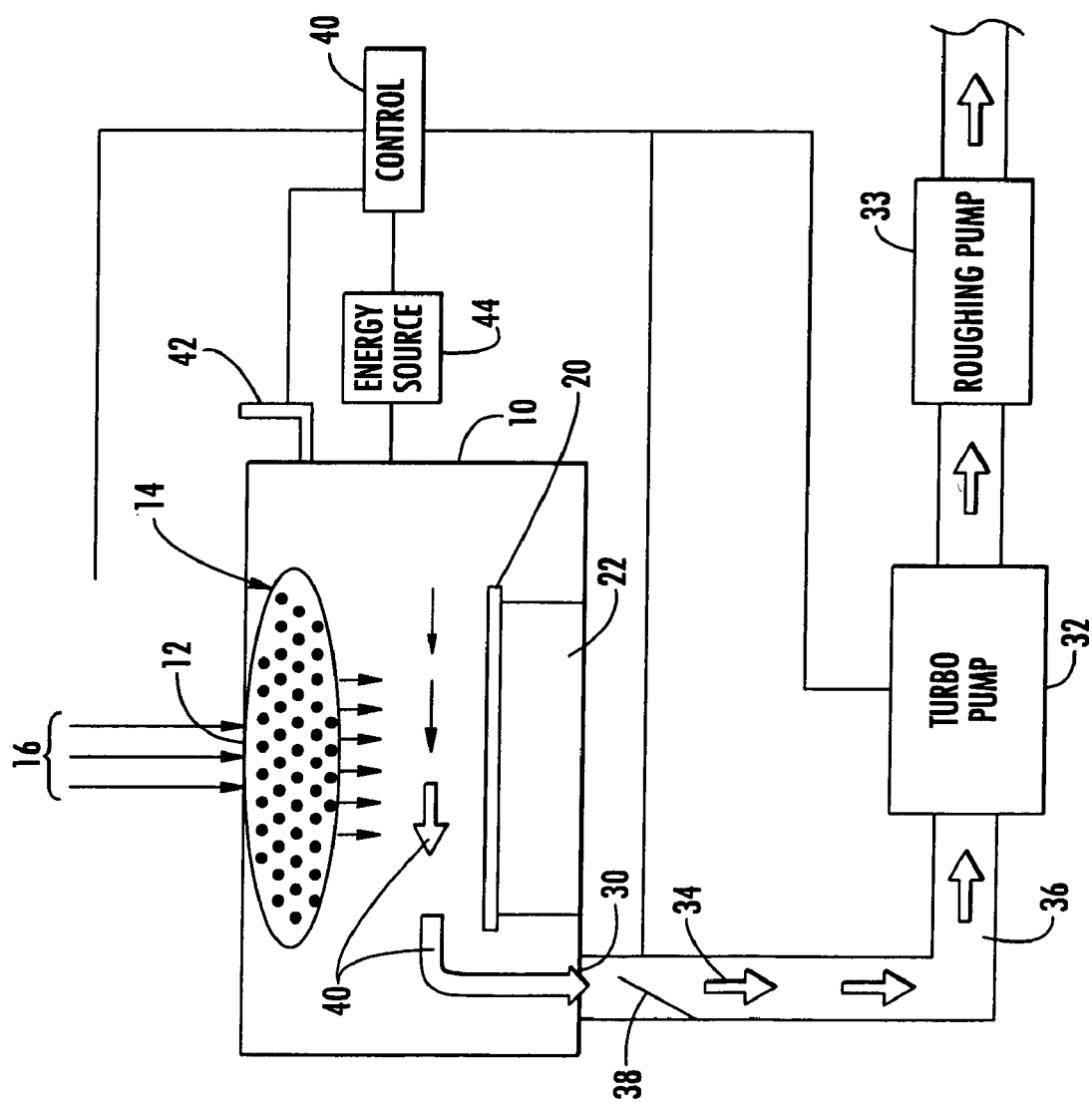
FIG. 1 is a diagram of an etcher in operation, according to the prior art.

An etcher, as shown in FIG. 1, includes a plasma chamber 10 with an inlet 12 and a gas distributor plate 14 for one or more reactant gases 16, with or without the carrier gas. A wafer 20 with a plurality of dies or integrated circuit is shown resting on a pedestal 22 in the chamber 10. The object 20 to be etched may also be a micro electronic machine or flat panel display. An outlet or exhaust port 30 of the chamber 10 is connected to a turbo pump 32 and a roughing pump 33 by conduits 34 and 36 to remove by-products. A throttle valve 38 is provided in conduit 34. A control 40 is connected to a pressure transducer 42 to control the opening of the throttle valve 38 to maintain a constant pressure in the chamber 10 and an even exit flow. An rf energy source 44 is provided to create the plasma. The control system may also control the flow rate and proportion of the gases 16, the turbo and roughing pumps 32, 33 and the energy source 44. The control system is shown as a block and is well known.

Initially, the reactant gas pressure was reduced substantially from the suggested or standard process of record (POR) by approximately one-half. As an example using CFx gas, reduction of pressure was from 400 mT to 200 mT. This produced an uneven horizontal gas flow because of the location of the exhaust port 30 at one side of the etching chamber 10. There was faster removal of by-products adjacent the exhaust port 30, and the removal rate was slower as one moved away from the exhaust port 30. This imbalance also caused an uneven or accelerated vertical flow adjacent the exhaust port 30. Thus, the area of the wafer 20 that is adjacent the exhaust port is subject to more etching compared to the remainder of the wafer surface due to faster removal of by-products. The removal of by-products is shown in FIG. 1 by the arrows 40. The size of the arrows 40 indicate their relative by-product removal rate across the wafer 20.

The carrier and reactant gas flows were increased at the lower pressure. For example, they were increased to approximately twice the POR flow rate. For example, the CF4 was increased from 42 sccm to 84 sccm, and the Argon was increased from 100 sccm to 300 sccm. This increase in the flow rate, and specifically of the Argon gas flow, produced a heavy load on the turbo pump 32. This caused the turbo pump 32 to work even harder and reduced the difference of the flow rate within the chamber 10. This resulted in less etching on the left side adjacent the exhaust port 30 when compared to the rest of the wafer 20 and resulted in improved etch uniformity. The relative small opening of the threshold valve 38 for the POR decreased the ability of the system to react to changes in flow rates and exacerbated the non-uniformity of etching and gas flows within the etching chamber 10. The small opening value of the throttle valve 38 also limits the variation of gas flow to maintain the desired selectively of the etch.

Figure 2:
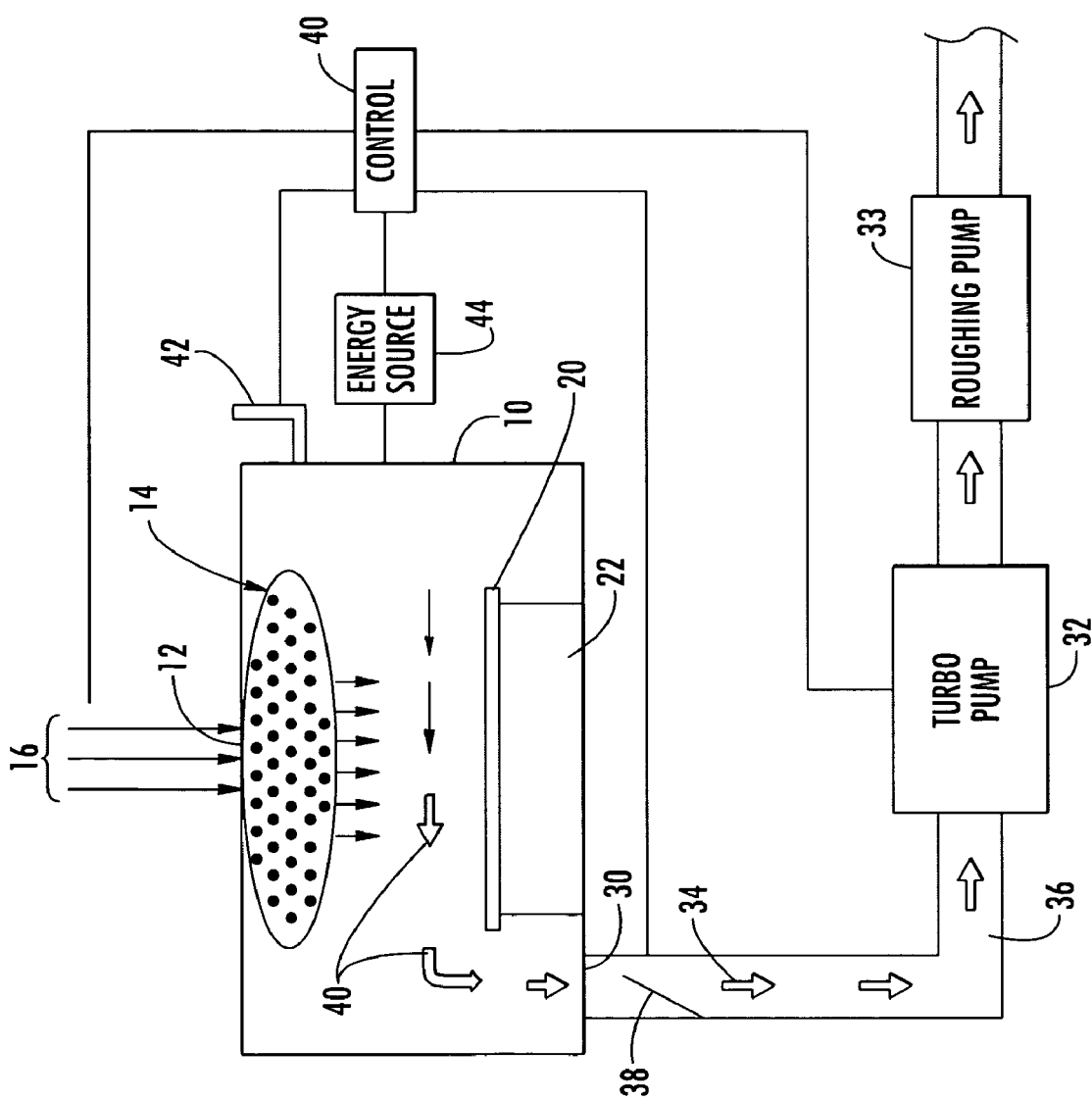
FIG. 2 is a diagram of the etcher in operation, according to the present disclosure.

The present disclosure determined that increasing the throttle valve's opening value to substantially greater than that of the POR substantially improved the flow rate within the chamber 10 and the ability of the system to accommodate fluctuations and variations in flow rate and turbo pump surges. The setting was changed from, for example, a POR of 9 up to close to 100. The resulting balance flow at the larger opening is illustrated in FIG. 2.

The present process shows that by reducing the pressure by at least, approximately one-half, increasing the gas flow by at least, approximately twice and increasing the throttle valve's open value by at least, approximately four times, the window of adjustability of the flow rate of the reactant gas doubled within the limits of desired etch selectivity. The design goal was for the etch selectivity to be in a range of 1.1 to 1.3 with a non-uniformity goal of less than 4% (1 sigma).

It also has been shown that the non-uniformity was substantially reduced. Actual results with the improved process easily achieved the selectivity goal and reduced the non-uniformity of pilot wafers from less than 4% for the POR to less than 2.5% for the new process. More importantly, non-uniformity across product wafers was significantly reduced from less than 2000 Angstroms for the POR to less than 600 Angstroms for the new process.

Figure 3:
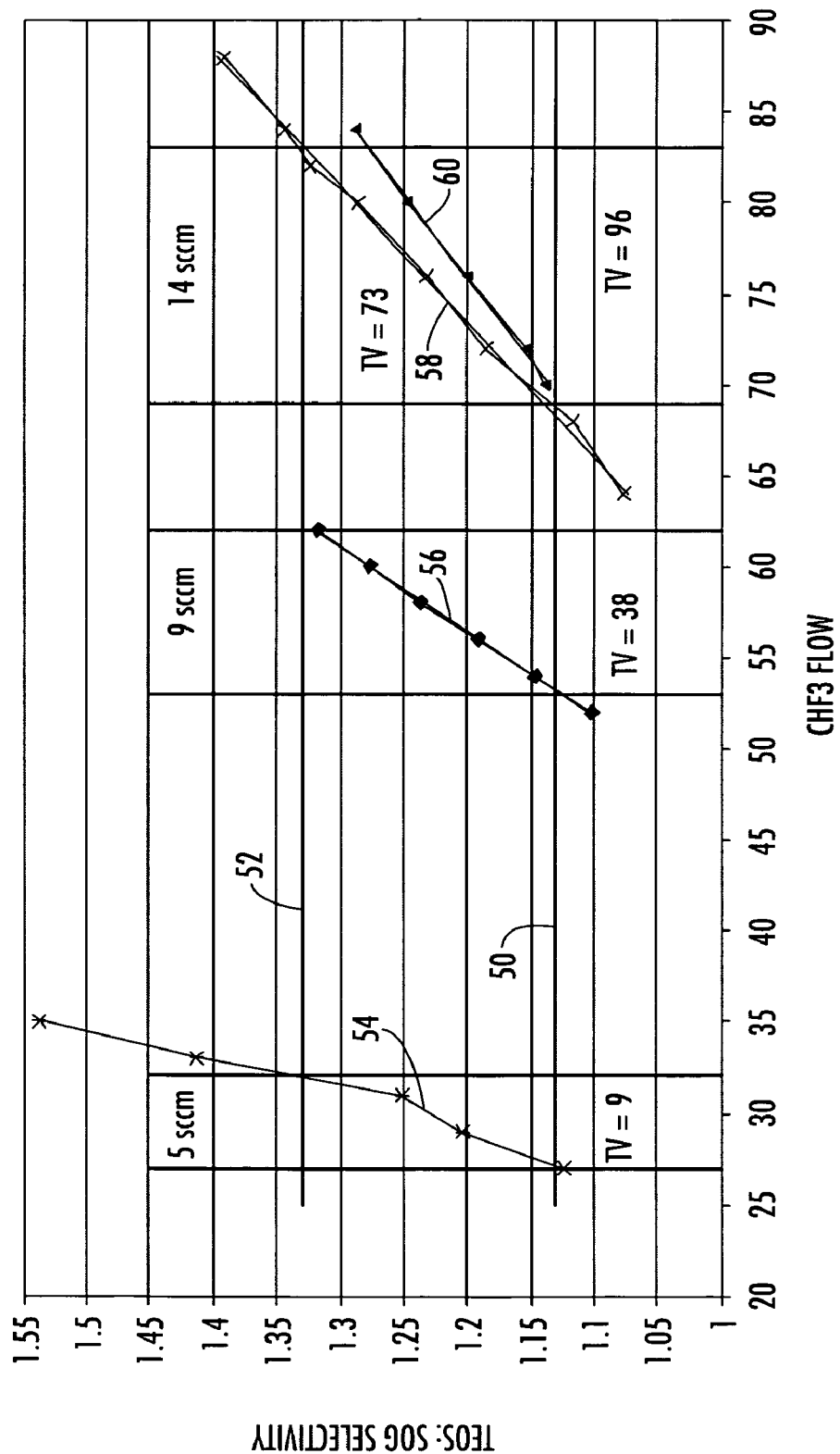
FIG. 3 are graphs of flow rate versus etch sensitivity.

As an example, the window of flow rate for the reactant gas approximately doubled for a throttle valve opening increase of four times. The window increased by three times for a throttle valve opening increase of approximately ten times. An example for CHF3 for the selectivity of TEOS: SOG is shown in FIG. 3. The selectivity limits of approximately 1.1 to 1.3 are shown as horizontal lines 50 and 52, respectively.

The first curve 54 is at a pressure of 400 mT, a flow rate for Argon of 100 sccm and a throttle valve opening value of 9. This is considered the POR. The resulting window for the CHF3 flow is 5 sccm. The second curve 56 is at a pressure of 400 mT, a flow rate for Argon of 200 sccm and a throttle valve opening value of 38. The resulting window for the CHF3 flow is 9 sccm. The third curve 58 is at a pressure of 200 mT, a flow rate for Argon of 200 sccm and a throttle valve opening value of 73. The resulting window for the CHF3 flow is 14 sccm. The fourth curve 60 is at a pressure of 200 mT, a flow rate for Argon of 300 sccm and a throttle valve opening value of 96. The resulting window for the CHF3 flow is 14 sccm with a more robust selectivity control as shown by the decreased slope when compared to curve 58.

From these results, increasing the flow rate of one of the gases and increasing the opening of the throttle valve produces a significant increase of the window of adjustability of the other gas. Further improvements are achieved by also decreasing the pressure and further increasing the opening of the throttle valve.

The use of a carrier gas, which is used in oxide etches, is not an absolute requirement depending upon the material being etched and the reactant gases used. For instance, plasma etching of AlCu metals using reactant gases of $Cl_2$, $BCl_3$, and $N_2$ are only required to generate a plasma and selectively etch the metal.

The capacity of the turbo pump 32 and the diameter of the conduits 34 and 36 are selected to minimize the time for emptying and drying the chamber 10 after a cleaning cycle. Thus, the standard procedure has the throttle valve wide open during the drying cycle and subsequently has to be substantially closed for the etching cycle. If the capacity of the turbo pump 32 and/or the diameter of the conduits 34, 36 are reduced to allow the throttle valve to be opened further during the etching cycle, the time for the drying cycle would have to be increased.

Figure 4:
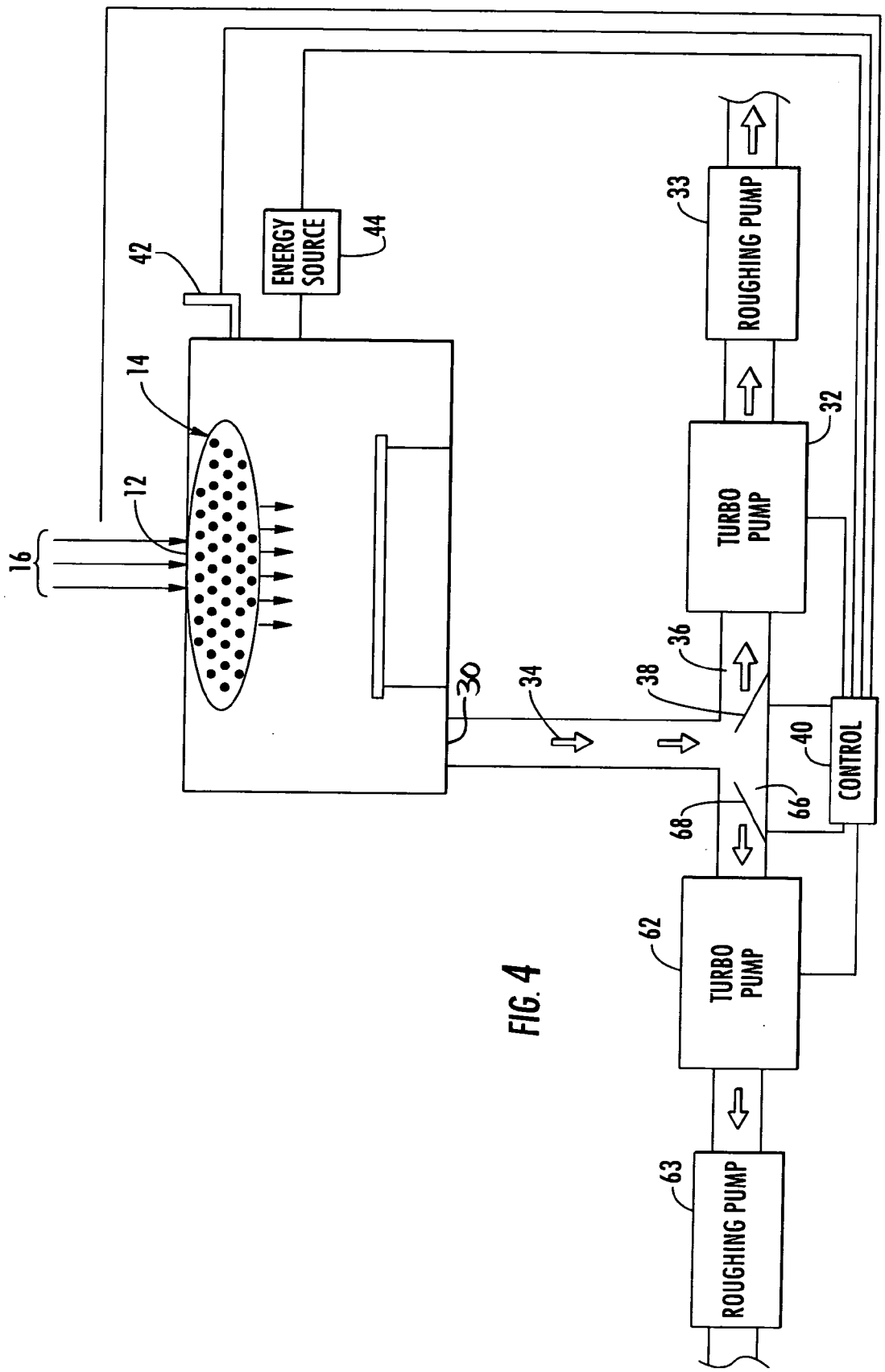
FIG. 4 is a diagram of another etcher in operation, according to the present disclosure.

FIG. 4 shows a solution to this problem. Connected to the exhaust port 30 is the conduit 34. The first turbo and roughing pumps 32, 33 are connected to the conduit 34 by conduit 36, which includes the first throttle valve 38. A second turbo pump 62 and roughing pump 63 are connected to the conduit 34 by conduit 66, which includes a second throttle valve 68. The capacity of the second turbo pump 62 is smaller than the capacity of the first turbo pump 32. The diameter of the conduit 66 is smaller than the conduit 36. The control 40 opens the first throttle valve 38 only during the drying cycle and opens the second throttle valve 68 only during the etching cycle. By having the lower capacity turbo pump 62 and conduit 66 open during the etching cycle, the throttle valve 68 can be wider open and, thus, the whole system is less susceptible to fluctuations of the pump. This should allow the pressure in the chamber and the rate of the gas to be at POR and still provide improved uniformity of etch and increased window of gas rate variation for the selectivity limits.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed:

1. A method of operating a plasma etcher which includes an inlet for a gas, a throttle valve connecting an exhaust port of a chamber to a pump and a control system to operate the throttle valve, the method of etching comprising:
   introducing gas into the etcher during etching at a substantially higher rate than a previous standard rate for a desired etch selectivity; and
   setting the throttle valve's open value during etching to a substantially greater open value than a previous standard open value in the range of 38/800 or greater of a full opening for the desired etch selectivity.

2. The method of claim 1, including introducing the gas at a lower pressure than the pressure of the previous standard pressure for a desired etch selectivity.

3. The method of claim 2, wherein the pressure is reduced by approximately one-half.

4. The method of claim 2, wherein the pressure is reduced by approximately one-half, and the rate is increased by approximately twice.

5. A method of reducing the non-uniformity of etching in and/or increasing the flow rate window of a gas in a plasma etcher for a desired etch selectivity, the etching method comprising:
   introducing gas into the etcher during etching at a substantially higher rate than a previous standard rate for a desired etch selectivity; and
   setting an open value of an exhaust throttle valve of the system during etching to a substantially greater open value than a previous standard open value in the range of 38/800 or greater of a full opening for the desired etch selectivity.

6. The method of claim 5, including introducing the gas at a lower pressure than the pressure of the previous standard pressure for a desired etch selectivity.

7. The method of claim 6, wherein the pressure is reduced by approximately one-half.

8. The method of claim 6, wherein the pressure is reduced by approximately one-half, and the rate is increased by approximately twice.

9. A plasma etcher comprising:
   a chamber with a gas inlet for at least one gas and an exhaust port;
   an energy applicator for creating a plasma;
   a first throttle valve connecting the exhaust port to a first pump via a first conduit;
   a second throttle valve connecting the exhaust port to a second pump via a second conduit, the first conduit having a larger diameter than the diameter of the second conduit; and
   a control system to operate the opening of the first throttle valve for a dry cycle after a cleaning cycle of the etcher and to operate the opening of the second throttle valve during an etching cycle.

10. A method of operating a plasma etcher which includes an inlet for a gas, a throttle valve connecting an exhaust port of a chamber to a pump and a control system to operate the throttle valve, the method of etching comprising:
    introducing gas into the etcher during etching at a substantially higher rate than a previous standard rate for a desired etch selectivity;
    introducing the gas into the etcher during etching at a pressure of 200 mT; and
    setting the throttle valve's open value during etching to a substantially greater open value than a previous standard open value for the desired etch selectivity.

11. The method of claim 10, wherein the throttle valve's open value is increased by approximately four times.

12. A method of operating a plasma etcher which includes an inlet for a gas, a throttle valve connecting an exhaust port of a chamber to a pump and a control system to operate the throttle valve, the method of etching comprising:
    introducing gas into the etcher during etching at a substantially higher rate than a previous standard rate for a desired etch selectivity;
    introducing a carrier gas at a rate in the range of 200 sccm or higher; and
    setting the throttle valve's open value during etching to a substantially greater open value than a previous standard open value for the desired etch selectivity.

13. The method of claim 12, wherein the rate is increased by approximately twice.

14. The method of claim 13, wherein the throttle valve's open value is increased by approximately four times.

15. A method of reducing the non-uniformity of etching in and/or increasing the flow rate window of a gas in a plasma etcher for a desired etch selectivity, the etching method comprising:
    introducing gas into the etcher during etching at a substantially higher rate than a previous standard rate for a desired etch selectivity;
    introducing the gas into the etcher during etching at a pressure of 200 mT; and
    setting an open value of an exhaust throttle valve of the system during etching to a substantially greater open value than a previous standard open value for the desired etch selectivity.

16. The method of claim 15, wherein the rate is increased by approximately twice.

17. The method of claim 16, wherein the throttle valve's open value is increased by approximately four times.

18. A method of reducing the non-uniformity of etching in and/or increasing the flow rate window of a gas in a plasma etcher for a desired etch selectivity, the etching method comprising:
    introducing gas into the etcher during etching at a substantially higher rate than a previous standard rate for a desired etch selectivity;
    introducing a carrier gas at a rate in the range of 200 sccm or higher; and
    setting an open value of an exhaust throttle valve of the system during etching to a substantially greater open value than a previous standard open value for the desired etch selectivity.

19. The method of claim 18, wherein the throttle valve's open value is increased by approximately four times.

* * * * *